US010442122B2

(12) United States Patent
Dean

(10) Patent No.: US 10,442,122 B2
(45) Date of Patent: Oct. 15, 2019

(54) BIO-SENSOR CIRCUIT

(71) Applicant: Johnson Electric International AG, Murten (CH)

(72) Inventor: Steven Eric Dean, Intervale, NH (US)

(73) Assignee: Johnson Electric International AG, Murten (CH)

( * ) Notice: Subject to any disclaimer, the term of this patent is extended or adjusted under 35 U.S.C. 154(b) by 626 days.

(21) Appl. No.: 15/093,174

(22) Filed: Apr. 7, 2016

(65) Prior Publication Data
US 2016/0299098 A1 Oct. 13, 2016

Related U.S. Application Data

(60) Provisional application No. 62/144,537, filed on Apr. 8, 2015.

(51) Int. Cl.
*B29C 45/14* (2006.01)
*H05K 3/28* (2006.01)
*H05K 3/00* (2006.01)

(52) U.S. Cl.
CPC .. *B29C 45/14639* (2013.01); *B29C 45/14065* (2013.01); *H05K 3/281* (2013.01); *B29C 45/14336* (2013.01); *B29C 2045/14122* (2013.01); *H05K 3/0014* (2013.01); *H05K 2201/10151* (2013.01); *H05K 2201/10681* (2013.01); *H05K 2203/1327* (2013.01); *H05K 2203/1545* (2013.01)

(58) Field of Classification Search
CPC .. G01N 27/327–3274; B29C 45/14639; B29C 45/14065; B29C 45/14336; B29C 2045/14122; H05K 3/281; H05K 3/0014; H05K 2203/1545; H05K 2203/1327; H05K 2201/10681; H05K 2201/10151
See application file for complete search history.

(56) References Cited

U.S. PATENT DOCUMENTS 4,584,767 A * 4/1986 Gregory ............ B29C 45/14639
174/255
6,662,439 B1 * 12/2003 Bhullar .............. G01N 27/3272
204/294

FOREIGN PATENT DOCUMENTS

WO WO 2005007866 1/2005

* cited by examiner

*Primary Examiner* — J. Christopher Ball
(74) *Attorney, Agent, or Firm* — Muncy, Geissler, Olds & Lowe, P.C.

(57) ABSTRACT

A bio-sensor circuit for detecting characteristics of a substance placed thereupon, the bio-sensor circuit has: a printed circuit having at least one electrically conductive contact sensor on a surface of the printed circuit, the electrically conductive contact sensor including a biochemical agent; and an electrically insulative coating affixed to the surface of the printed circuit, the electrically insulative coating having a well associated with the electrically conductive contact sensor, thereby leaving the electrically conductive contact sensor exposed through the electrically insulative coating, the electrically insulative coating being a resinous compound formed by injection molding. An electrochemical change resulting from the interaction of the substance to be characterized and the biochemical agent creates a detectable electrical potential at the electrically conductive contact sensor. A system and method of creating such a circuit via injection molding is also provided.

4 Claims, 5 Drawing Sheets

BIO-SENSOR CIRCUIT

CROSS REFERENCE TO RELATED APPLICATIONS

This non-provisional patent application claims priority under 35 U.S.C. § 119(e) from Provisional Patent Application No. 62-144,537 filed in USA on Apr. 8, 2015, the entire contents of which are hereby incorporated by reference.

FIELD OF THE INVENTION

The present invention relates to a bio-sensor, primarily but not necessarily exclusively, for the enzymatic characterization of biological samples, the bio-sensor being formed via an injection molding process. The invention further relates to a reel of printed circuits, and an associated system, for use in the production of the bio-sensors. The invention also relates to a method of producing the bio-sensors, and to a method of coating a circuit using an injection molding technique.

BACKGROUND OF THE INVENTION

It is known to provide a micro-fluidic bio-sensor, comprising an electrically conductive layer and an overlaid insulating material. Such devices are used for testing, typically liquid, samples enzymatically, as a cheap and simple alternative to laborious laboratory tests. WO 2005/007866 discloses one such device for the measurement of ion transport, having an upper chamber piece comprising at least one well, with a chip attached to the bottom of the upper chamber piece, the wells aligning with at least one ion transport measuring means.

The electrically conductive layer of such devices generally comprises a plurality of electrical contact pads having the relevant enzyme attached to the surface thereof, and liquid receptacles are formed over the top of these contact pads, into which the solution to be tested is poured.

The electrochemistry of the reactions between the surface enzymes and the liquid to be characterized can then be measured using cyclic voltammetry (hereinafter referred to as 'CV'), which allows for the determination of relevant characteristics relating to the liquid. For optimum CV to occur, the liquid receptacles associated with different contact pads must be of a consistent volume, which is only achievable by being able to form regular, accurately sized liquid receptacles or 'wells'.

There are many plausible ways of creating such wells based on existing technology, each of which have particular drawbacks. The first such technique is that of the photo-imaged solder mask. This involves the application of a thin, lacquer-like polymer to the surface of a printed circuit, and this is a technique commonly used in the formation of printed circuit boards (hereinafter referred to as 'PCB').

However, for optimum CV, there must is a minimum required depth, typically of 100 µm, in order to contain sufficient fluid in each well. This is very expensive for solder masking, since not only is the raw material expensive, but the application process also has many involved steps.

Additionally, where a deep solder mask has been utilized, there will be a tendency for the sidewalls of the defined recess or well to be sloped rather than straight, which limits the effectiveness of the wells leading to inconsistencies in the well volume between different wells and consequently test results.

An alternative method of well creation is to use a thermally laminated cover layer. This involves the application of a thermally-set laminate adhesive over the top of the printed circuit. However, in this scenario, the wells must be cut, punched or ablated from the laminate, which is less than ideal. Again this results in an expensive, multi-step process.

The likelihood of adhesive flow must also be considered; the thermally-set adhesive is prone to flowing like a viscous fluid during the setting process, which again can result in inconsistently sized and shaped wells, reducing the efficacy of the CV analysis.

A final option would be to use a pressure sensitive adhesive instead of a thermally-setting equivalent. However, the extraction of the wells is a problem, since the nature of the bonding of this type of adhesive increases the probability of 'tear-out', that is, the formation of undesirable voids in the insulative layer during punching or drilling of the wells.

Additionally, since such adhesives are generally quite 'spongy' or porous, they are very susceptible to moisture absorption, which may have undesirable effects on the enzymes of the circuitry. To counteract this, pressure-sensitive adhesives are preferably created with very shallow wells. However, shallow wells increase the likelihood of enzymatic cross-contamination between wells, which is undesirable.

Research has been performed using the above options, and it is thus an object of the present invention to provide a bio-sensor which avoids or obviates the stated problems.

SUMMARY OF THE INVENTION

According to a first aspect of the invention, there is provided a bio-sensor circuit for detecting characteristics of a substance placed thereupon, the bio-sensor circuit comprising: a printed circuit having at least one electrically conductive contact sensor on a surface of the printed circuit, the said at least one electrically conductive contact sensor including a biochemical agent; and an electrically insulative coating affixed to said surface of the printed circuit, the electrically insulative coating having a well associated with the at least one electrically conductive contact sensor, thereby leaving the at least one electrically conductive contact sensor exposed through the electrically insulative coating, the electrically insulative coating being a resinous compound formed by injection molding, so that an electrochemical change resulting from the interaction of the substance to be characterized and the biochemical agent results in a detectable electrical potential at the or each electrically conductive contact sensor.

The optimal properties of a bio-sensor circuit having wells into which a substance to be characterized can be placed are that the wells are of uniform size and rigidity. The dimensions of said wells are determined by their depth, radius, and uniformity of inner walls, preferably being normal to the surface from which they extend. The rigidity of the wells ensures that the volume of the wells do not substantially change during formation, due to, for example, adhesive flow.

By using a resinous compound to form the electrically insulative layer of any such bio-sensor circuit, many of these criteria are met. The uniformity of dimension can be achieved by molding the resin around a template, such that, when the resin sets, it forms a well of the dimension of the template. This can be readily achieved by using an injection molding technique. Furthermore, resinous compounds have minimal adhesive flow, ensuring no deformation of the wells following setting of the coating.

Critically, formation of a bio-sensor circuit using such a technique is a single-step process, removing the need for subsequent punching of holes or ablation of the insulative coating following formation, which can lead to irregularities in the dimensions of the wells.

Optionally, the bio-sensor circuit may further comprise a metering layer lain over the electrically insulative coating, the metering layer including a slot of a uniform dimension along at least a majority of its longitudinal extent so as to accept a predetermined volume of a liquid therein, wherein the slot is positionable such that the liquid therein contacts said at least one electrically conductive contact sensor, the characteristics of the liquid thus being determinable. Furthermore, the metering layer may be integrally formed with the electrically insulative coating.

A metering layer, either integrally formed or separate to the electrically insulative layer can advantageously enable a user to insert a set volume of the substance to be characterized therein, ensuring uniformity of subsequent measurements. In practice, this would typically involve the dispensing of a certain volume of a patient's blood.

Preferably, the biochemical agent may be enzymatic, with there preferably being a plurality of electrically conductive contact sensors which may be provided on the surface of the printed circuit, with a different said biochemical agent perhaps being provided with each electrically conductive contact sensor, allowing for a plurality of characteristics of the substance to be characterized to be determined.

Typically, such a bio-sensor would be set up to measure ion transport or similar changes in electrochemical potential. As such, enzymes are a typical biological agent used in order to generate the necessary electrical potential changes, and these are ideally associated with the electrically conductive contact sensors.

Optionally, the electrically insulative coating may be of a uniform depth, which is ideally of a depth of at least 100 μm. However, depths in the range of 50 to 300 μm are possible. The side walls of the or each well may also be formed so as to be or substantially be normal to the surface of the circuit.

One of the benefits of using a resinous compound to form the electrically insulative coating is that, once set, the resin will remain substantially unchanged for the duration of its lifetime. As such, dependent upon the method of production, and in particular where injection molding is utilized, the relevant features of the or each well can be rigorously regulated.

Preferably, the said at least one electrically conductive contact sensor may be formed from an electrically conductive noble metal, and the printed circuit may optionally be a flexible printed circuit. Alternatively, the printed circuit may be semi-flexible, rigid or formed from strips of rigid printed circuits.

For accurate cyclic voltammetry analysis, a noble metal finish must be used for the electrically conductive contact sensors; the analysis is unfeasible where printed ink sensors have been utilized. Modern advances in flexible circuitry have ensured that noble metal components can be affixed to flexible substrates, and this is highly relevant for bio-sensor circuits as herein described, since the formation of the circuits may be preferably preformed using a reel-to-reel method, therefore likely requiring a flexible substrate for storage.

According to a second aspect of the invention, there is provided a bio-sensor circuit production reel for use in the production of bio-sensor circuits, comprising: an elongate substrate formed from a strip of electrically insulative material, the substrate including an engagement portion to enable actuation and/or alignment of the reel in a longitudinal direction; and a plurality of printed circuits printed in a parallel spaced-apart arrangement along the length of the substrate.

As alluded to above, it is advantageous to provide a reel for the production of bio-sensor circuits. To perform injection molding on a quasi-continuous basis, it is likely necessary to actuate the bio-sensor circuits through an injection molding tool, engaging the injection molding tool to create the electrically insulative coating.

Preferably, the substrate may be formed from a pliantly flexible material, and the engagement portion may be a plurality of index holes positioned symmetrically at or adjacent to both longitudinal sides of the substrate. Said index holes may optionally be positioned in accordance with ISO standards.

Beneficially, the actuation of the reel through the injection molding tool allows for a quasi-continuous production method for resultant bio-sensor circuits. This actuation and/or alignment can be readily achieved by utilizing standard ISO 1007 type 35 mm film, the film being engagable with a toothed roller to enable actuation. This allows for the production of bio-sensor circuits to a well-regarded standard.

According to a third aspect of the invention, there is provided a bio-sensor circuit system for the production of bio-sensor circuits comprising: a bio-sensor production reel having an elongate substrate formed from a strip of electrically insulative material, the substrate including a plurality of index holes positioned symmetrically at or adjacent to the both longitudinal sides of the substrate to enable actuation of the reel in a longitudinal direction, and a plurality of printed circuits printed in a parallel arrangement along the length of the substrate, the printed circuits each including at least one electrically conductive contact sensor; an injection molding tool having upper and lower injection mold elements being disposed above and below upper and lower surfaces of the reel, upper and lower injection mold elements being capable of being actuated into engagement with the reel, thereby forming a cavity about each printed circuit between the upper and lower injection mold elements, the injection molding tool further including at least one abutment element capable of engaging with a portion of the surface of the reel inside the cavity when the upper and lower injection mold engagement elements are actuated into engagement with the reel; and a sprocket feed roller capable of engagement with the index holes of the reel, wherein the roller is rotatable so as to effect actuation of the reel through the injection molding tool.

The system of production of bio-sensor circuits enables a quasi-continuous batch process to be utilized to create said circuits. The portions of the reel which are positioned within the injection molding tool can have their electrically insulative coatings applied, after which, the reel can be actuated onwards to position the next set of printed circuits to enter the injection molding tool.

Such a system enables rapid injection molding of the layers of a great number of bio-sensor circuits, ensuring an overall reduction in the cost of manufacture when compared with non-reel-to-reel techniques. Additionally, the use of the injection molding process ensures that the wells of the resultant bio-sensor circuits are of uniform dimensions, ensuring that the circuits produce highly accurate measurements.

According to a fourth aspect of the invention, there is provided a method of producing bio-sensor circuits using the bio-sensor circuit system of the third aspect of the invention, comprising the steps of: a] actuating the reel using the sprocket feed roller so as to position at least one printed circuit between upper and lower injection mold elements; b] actuating the upper and lower injection mold elements towards one another so as to form a cavity about the printed circuit, such that the said at least one abutment element contacts a relevant portion of the surface of the said at least one electrically conductive contact sensor; c] injecting a resinous substance into the cavity so as to cover an exposed area of the surface of the printed circuit; d] allowing the resinous substance to set and affix to the surface of the printed circuit; and e] separating the upper and lower injection mold elements leaving the set resinous substance as an electrically insulative coating on the surface of the printed circuit, a well being formed in the resinous substance at or adjacent the or each electrically conductive contact sensor as a result of the positioning of the said at least one abutment element, thereby forming a bio-sensor circuit.

The aforementioned system may be most readily used with an injection molding tool which has upper and lower injection mold elements which can be actuated towards the reel to engage with the substrate there between. This ensures firstly that the reel is held firmly within the injection mold too, ensuring accurate placement of the wells relative to the underlying contact sensors, but also advantageously allows for an insulative coating to be provided on both sides of the reel.

Preferably, the method may further comprise a step f], subsequent to step e], of separating the individually formed bio-sensor circuits from the reel following formation to form discrete bio-sensor circuits.

It is possible to provide the reel as a single product having a plurality of bio-sensor circuits formed thereupon, but it may be more beneficial to separate out the circuits for individual distribution.

Optionally, the method may be repeatable as a reel-to-reel process.

The unwinding and rewinding of the reel in a reel-to-reel process, being an analogue of the reel-to-reel systems used in cassette players or film reels allows for near-continuous production of bio-sensor circuits as the reel is fed through the injection molding tool.

According to a fifth aspect of the invention, there is provided a method of applying an electrically insulative coating to a circuit having at least one electrically conductive contact sensor on a surface of the circuit, the method comprising the steps of: a] enclosing the circuit within a cavity formed by the at least one injection molding tool; b] injecting a resinous substance into the cavity so as to cover an exposed area of the surface of the circuit; c] allowing the resinous substance to set and affix to the surface of the circuit; and d] removing the or each injection molding tool, leaving the set resinous substance as an electrically insulative coating on the surface of the circuit.

Optionally, the injection molding tool may be provided with at least one abutment element, and, during step a], the said at least one abutment element abuts and covers or substantially covers the or each electrically conductive contact sensor of the circuit, a straight-sided well being formed in the resinous substance during step c] at or adjacent the or each electrically conductive contact sensor as a result of the positioning of the or each abutment element.

Advantageously, it is possible to apply an electrically insulative coating to any bio-sensor circuit, either with or without wells, by using an injection molding method so as to ensure consistency and uniformity of the applied resinous layer. This in turn increases the consistency of measurement between like circuits.

BRIEF DESCRIPTION OF THE DRAWINGS

A preferred embodiment of the invention will now be described, by way of example only, with reference to figures of the accompanying drawings. In the figures, identical structures, elements or parts that appear in more than one figure are generally labeled with a same reference numeral in all the figures in which they appear. Dimensions of components and features shown in the figures are generally chosen for convenience and clarity of presentation and are not necessarily shown to scale. The figures are listed below.

DETAILED DESCRIPTION OF THE PREFERRED EMBODIMENTS

Reference will now be made in detail to a preferred embodiment of the bio-sensor circuit, examples of which are also provided in the following description. Exemplary embodiments of the bio-sensor circuit are described in detail, although it will appear apparent to those skilled in the relevant art that some features that are not particularly important to an understanding of the bio-sensor circuit may not be shown for the sake of clarity.

Furthermore, it should be understood that the bio-sensor circuit is not limited to the precise embodiments described hereafter and that various changes and modifications thereof may be effected by one skilled in the art without deviating from the spirit or scope of the invention. For example, elements and/or features of different illustrative embodiments or aspects may be combined with each other and/or substituted for each other within the scope of this disclosure and appended claims.

In addition, improvements and modifications which may be apparent to persons of ordinary skill in the art after reading this disclosure, the drawings and the appended claims are deemed within the spirit and scope of the invention and protection sought.

Figure 1:
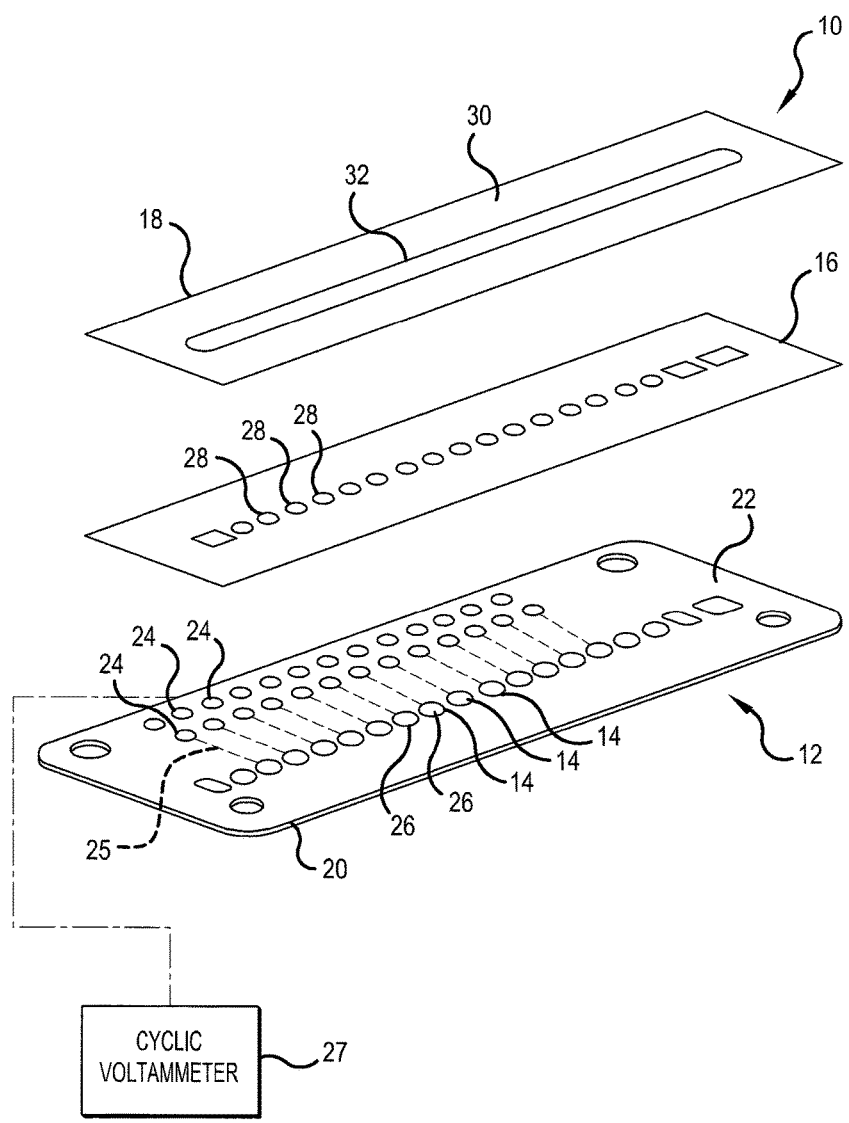
FIG. 1 shows an exploded perspective view of one embodiment of a bio-sensor circuit, according to the first aspect of the invention.

Referring firstly to FIG. 1, there is shown globally at 10 an exploded perspective view of an embodiment of a bio-sensor circuit. The bio-sensor circuit 10 is a layered piece of equipment or device, comprising a printed circuit 12 having at least one, and typically a plurality of, electrically conductive contact sensor(s) 14. Overlying at least in part the printed circuit 12, and more particularly the sensors 14, is an electrically insulative coating layer 16. As shown in the depicted embodiment, there may also be a metering layer 18 on top of the electrically insulative coating layer 16.

The bio-sensor circuit 10 is primarily used for the detection of certain characteristics of a substance which contacts with the or each contact sensor 14. Generally, the substance will be a liquid, such as blood, or another biological or medical sample. It is therefore critical that access to the contact sensors 14 be maintained. For ease of use, the contact sensors 14 are preferably arranged along a single axis running along the printed circuit 12, in this case being in a longitudinal direction.

The printed circuit 12 as shown includes a circuit substrate 20, which may be formed from a rigid, semi-flexible or preferably flexible plastics material, onto which the plurality of contact sensors 14 are printed on an upper surface 22 of the printed circuit 12. The contact sensors 14, in addition to further electrically conductive components of the printed circuit 12, are formed from a highly electrically conductive metal, generally one of gold, silver, palladium, platinum or copper, but not limited to these metals. To provide a baseline resistance to oxidation, noble metals are preferable.

The printed circuit 12 further includes a plurality of connection contact elements 24 which are in electrical communication with respective electrical contact sensors 14 through electrically conductive tracks 25, indicated as dotted lines in FIG. 1. The electrically conductive tracks 25 are preferably on the underside of the printed circuit 12, as shown, but may additionally or alternatively be on the upper side to allow a cost-reduction if, for example, the flexible printed circuit is only single sided. The connection contact elements 24 are connectable to test equipment external to the bio-sensor circuit 10, such as cyclic voltammetry apparatus 27.

The contact sensors 14 are formed typically as circular pads of conductive metal, and onto the exposed surface of each contact sensor 14 is affixed a biochemical agent 26 such as an enzyme. The same or a different biochemical agent 26 may be applied to each contact sensor 14 so as to allow for a plurality of different characteristics of the substance to be characterized to be determined.

The electrically insulative coating 16 is formed from a resinous plastics material, such as an epoxy, and has two functions. Firstly, the electrically insulative coating 16 acts as a protective layer to the underlying printed circuit 12, limiting physical damage, as well as the effects of corrosion. Furthermore, there is a plurality of openings or wells 28 passing through the electrically insulative coating layer 16, and these are positioned so as to correspond with the contact sensors 14 of the printed circuit 12.

The wells 28 are substantially cylindrical apertures running through the electrically insulative coating layer 16. When the coating 16 is applied to the printed circuit 12, the underlying contact sensors 14 and biochemical agents 26 thereupon will remain exposed with the wells 28 being positioned coaxially or substantially coaxially therewith.

The substance to be characterized can therefore be inserted into the respective wells 28 so as to contact with the contact sensors 14. The wells 28 themselves are ideally of uniform dimensions, to ensure consistency between the measurements at each contact sensor 14, having a set radius and side walls which are as close to being normal to the upper surface 22 of the printed circuit 12 as possible. In order to maintain a constant depth of well 28, the coating layer 16 must be of uniform thickness, and preferably this will be at least 100 However, a coating thickness between 50 and 300 μm is also usable.

The metering layer 18, as is present in the best embodiment of the invention, comprises a, preferably rigid or semi-rigid, laminar body 30 and an elongate slot 32 running along its length. This slot 32 has a predetermined width, length and depth, thereby having a uniform or substantially uniform lateral cross-sectional profile along at least a majority of its longitudinal extent, so as to define a constant volume. As such, when the metering layer 18 is positioned over the coating layer 16, a predetermined volume of substance to be characterized can be inserted. This ensures consistency between measurements using the bio-sensor circuit 10.

In use, the layered structure of the bio-sensor circuit 10 will be assembled, such that at least the majority of the upper surface 22 of the printed circuit 12 is covered by the electrically insulative coating 16, with the exception of the contact sensors 14, which are exposed via the plurality of wells 28. The metering layer 18 is then overlain, to define a liquid reservoir for the substance to be characterized to be inserted there into.

Testing equipment, such as cyclic voltammeters, can then be connected to the connection contact elements 24, via which, any change in electrical or electrochemical potential at the contact sensors 14 can be monitored. Any such potential change will arise due to an interaction of the substance to be characterized with the biochemical agent 26 which is associated with each respective contact sensor 14.

Given that the substance to be tested is highly likely to be a liquid, there is a reasonable probability of cross-contamination of biochemical agents 26 between the individual contact sensors 14 if the depth of the wells 28 is insufficient. This is one of the prime reasons for the walls of the wells 28 needing to be normal or substantially normal to the upper surface 22 of the printed circuit 12.

In the present invention, it is critical that the electrically insulative cover layer 16 of the bio-sensor 10 is formed from a resinous material having minimal adhesive flow during setting. The use of temperature or pressure sensitive adhesives has previously led to wells having tapered sides, increasing the risk of enzymatic cross-contamination and reducing the consistency between the well volumes. This in turn reduces the accuracy of any subsequent CV measurements.

The most common scenario in which such a bio-sensor 10 would be used is in the determination of characteristics associated with a patient's blood sample, with the biochemical agents 26 being enzymes which may interact with various constituent parts of the blood sample to create an electrical potential as ion concentrations change.

The present invention therefore creates a means of providing a bio-sensor having highly accurately dimensioned wells into which a substance to be tested can be inserted, thereby creating a more accurate sensor and testing apparatus. The bio-sensor will also be cheaper to manufacture, since the resinous compound is presently considerably cheaper to form as a layer of the requisite depth for the wells than any of the existing alternatives, in particular with respect to solder masks.

Figure 2:
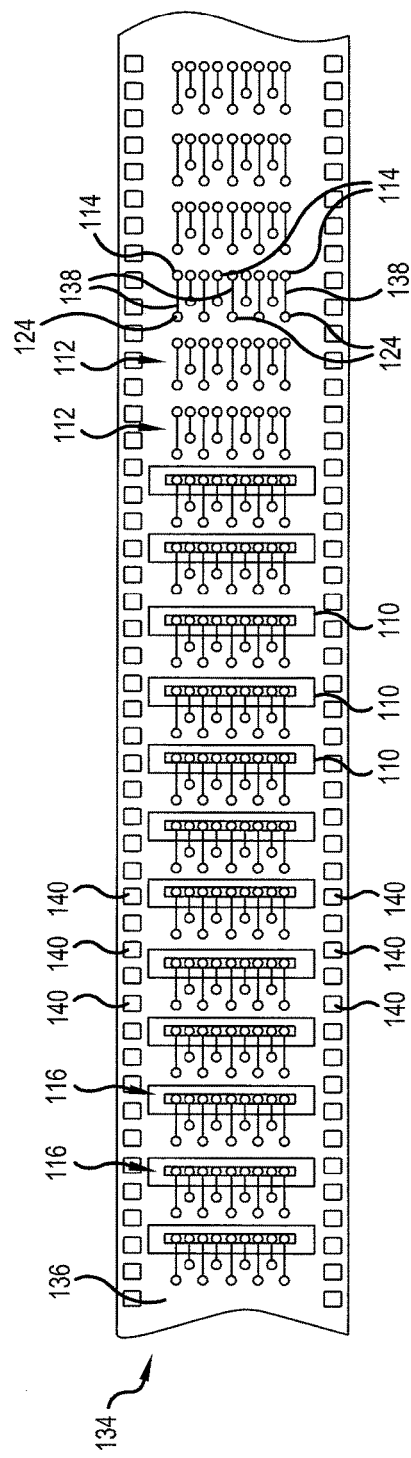
FIG. 2 shows a plan view of a bio-sensor circuit production reel, according to the second aspect of the invention.

In order to produce bio-sensor circuits as described here before on an industrial scale, it would be ideal to find a means of producing the bio-sensor circuits in bulk using a continuous or quasi-continuous process. This can be achieved in accordance with the present invention by using a bio-sensor circuit production reel, indicated globally in FIG. 2 as 134.

When referring to bio-sensor circuits hereafter, identical or similar reference numerals are used to refer to identical or similar components, and further detailed description is therefore omitted for brevity.

The reel 134 is an elongate strip, being a ribbon-shaped or web-like substrate 136 formed from a flexible or pliantly flexible plastics material. The relevant circuit portions of bio-sensor circuits 110 are then printed onto the reel 134 in a parallel spaced-apart arrangement along the length of the substrate 136, these circuit portions being the electrically conductive contact sensors 114, the connection contact elements 124 and the intermediate connective tracks 138, shown in this embodiment. Portions of the substrate 136 and the relevant circuit portions thus form a printed circuit indicated generally by 112. Optionally, an anti-corrosion layer may be applied to the circuit portions.

The reel 134 itself includes a plurality of index holes 140 positioned symmetrically along both longitudinal sides of the substrate. Typically, the substrate 136 will be standard 35 mm film, with the positions of the index holes 140 corresponding with a given ISO standard, such as ISO 1007.

The reel 134 is capable of being wound onto a reel core, and transferred to another reel core in a reel-to-reel process. In such a scenario, the reel 134 can be actuated from one position to another.

Figure 3:
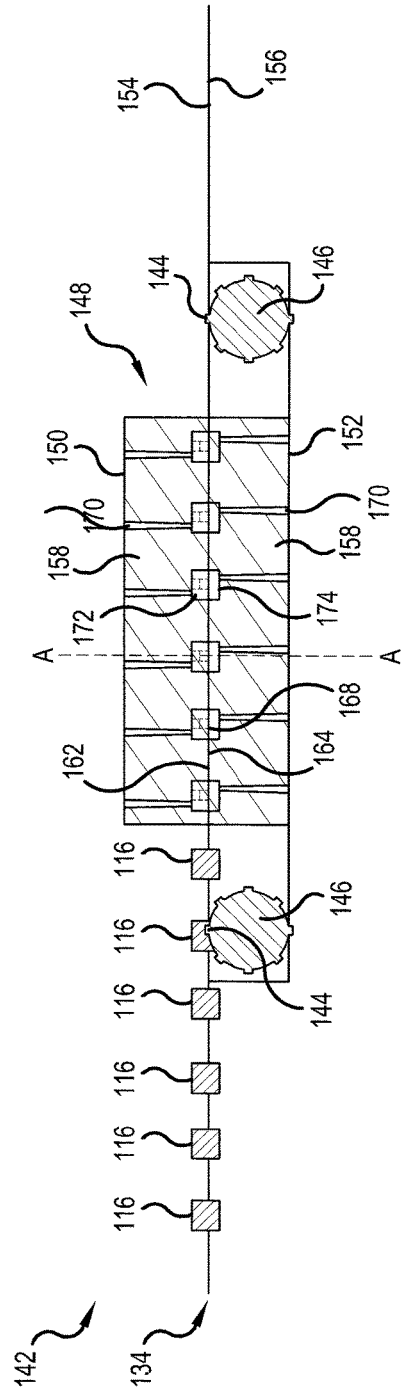
FIG. 3 shows a diagrammatic side view of a system for the production of bio-sensor circuits, according to the third aspect of the invention, utilizing the bio-sensor circuit production reel of FIG. 2.

Initially, the reel 134 will not include any electrically insulative cover layers 116 applied to the printed circuit 112; however, this can be applied to the printed circuit 112 during a reel-to-reel transfer. A system for applying the electrically insulative cover layers 116 to the printed circuits 112 of a reel 134 is shown in FIG. 3.

The system 142 is designed for the application of injection molded electrically insulative cover layers 116 to the printed circuits 112 of the bio-sensor circuits 110. The reel 134 is positioned such that its index holes 140 engage with the spigots 144 of at least one, and preferably two, sprocket feed rollers 146. Synchronous rotation of said sprocket feed rollers 146 will effect linear actuation of the reel 134.

Along the length of the reel 134, and preferably between the two sprocket feed rollers 146, there is positioned an injection molding tool 148. In the embodiment of the system shown, this injection molding tool 148 comprises upper and lower injection mold halves or elements 150, 152. The upper injection mold element 150 is positioned so as to be above an upper surface 154 of the reel 134, and the lower injection mold element 152 is positioned so as to be below a lower surface 156 of the reel 134.

Each injection mold element 150, 152 comprises a main body 158, typically formed from a solid block of metal such as steel, and having a recessed portion 160 on one face. This will be the bottom face 162 of the upper injection mold element 150 and the top face 164 of the lower injection mold element 152. A perimeter 166 of each of the respective faces 162, 164 is complementarily shaped, such that a cavity 168 is formable there between when the two injection mold elements 150, 152 are brought together into contact about the printed circuit 112.

Through the main body 158 of each of the injection mold elements 150, 152 is provided an injection channel 170 through which the resinous compound may injected into the cavity 168 during use.

The upper and lower injection mold elements 150, 152 are actuatable towards and away from one another when in position about the reel 134. In this instance, when the elements 150, 152 are substantially in communication with one another, the substrate 136 of the reel 134 will divide the cavity 168 into upper and lower cavities 172, 174: the upper cavity 172 being formed above the upper surface 154 of the reel 134; and the lower cavity 174 being formed below the lower surface 156 of the reel 134.

The recessed portion 160 of each injection mold element 150, 152 may include one or more abutment elements 176, projecting from inside the recessed portion 160 such that a distal end 178 of the or each abutment element 176 lies flush with the appropriate face 162, 164. These abutment elements 176 are positioned such that said distal ends 178 cover or substantially abut the contact sensors 114 of a printed circuit 112 placed between the upper and lower injection mold elements 150, 152.

The abutment elements 176 extend from an innermost surface 180 of the recessed portion 160, and are cylindrical in shape, extending normally to the appropriate face 162, 164. These abutment elements 176 are therefore the formers for the wells 128 of the bio-sensor circuits 110.

The method of using the system 142 is illustrated in FIGS. 4a to 4e. Each of the Figures shows a cross-section through the apparatus notionally along line A-A as indicated in FIG. 3.

In use, the reel 134 will be actuated and/or aligned such that at least one printed circuit 112 is positioned within the confines of the injection molding tool 148. This arrangement can be seen in FIG. 4a.

Upper and lower injection mold elements 150, 152 will then be actuated towards the reel 134, thereby forming the upper and lower cavities 172, 174. The distal ends 178 of the abutment elements 176 will subsequently contact with and protect the intended contact sensors 114, shown in FIG. 4b.

Figure 4A:
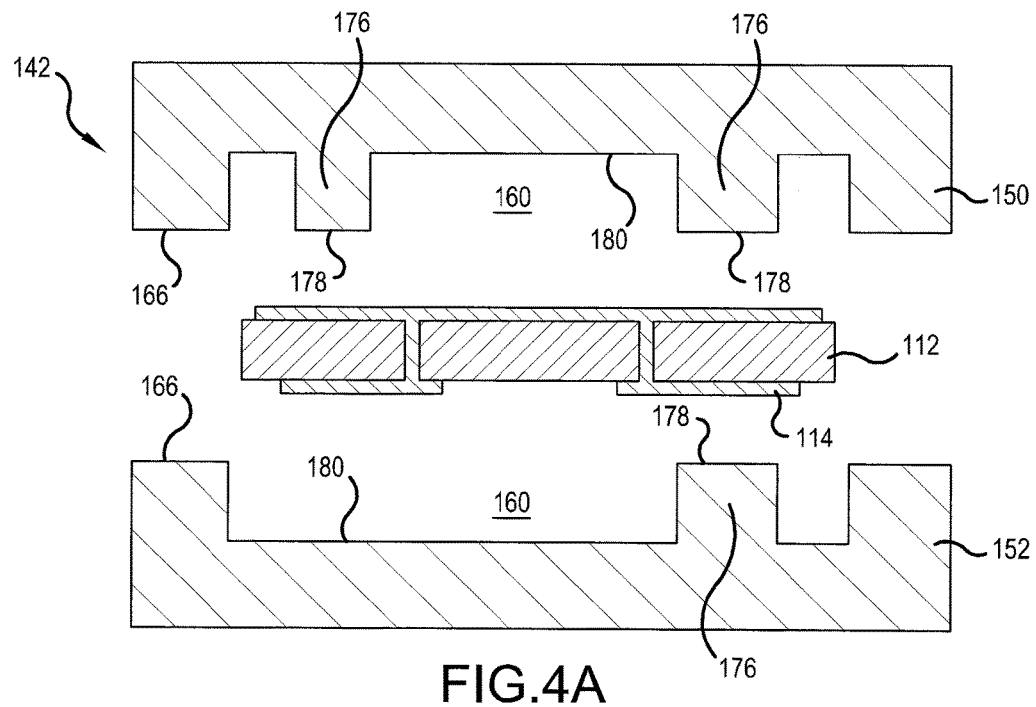
FIGS. 4a to 4e show cross-sectional representations of the injection molding tool used in the system of FIG. 3, during the sequential steps in the production of the bio-sensor circuits.
Figure 4B:
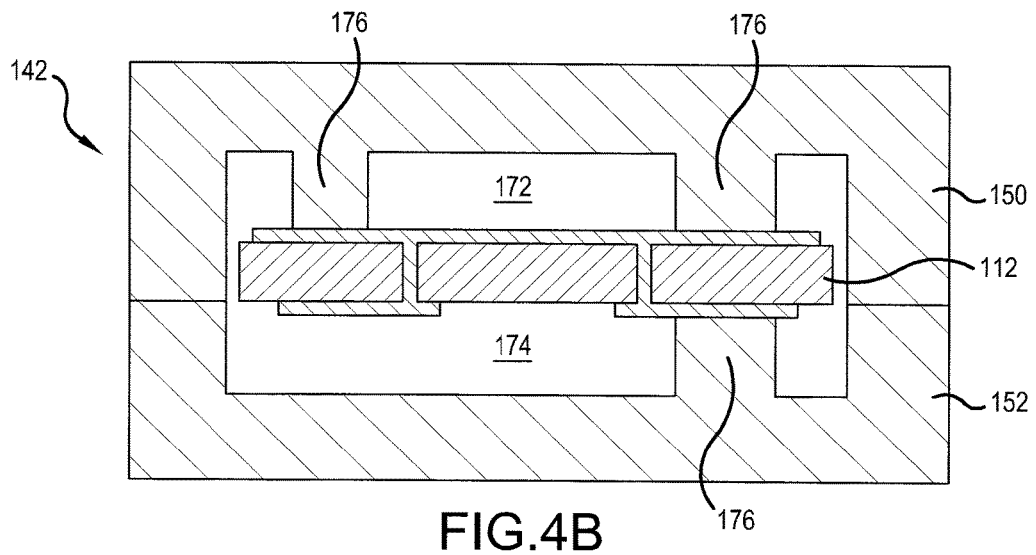
Figure 4C:
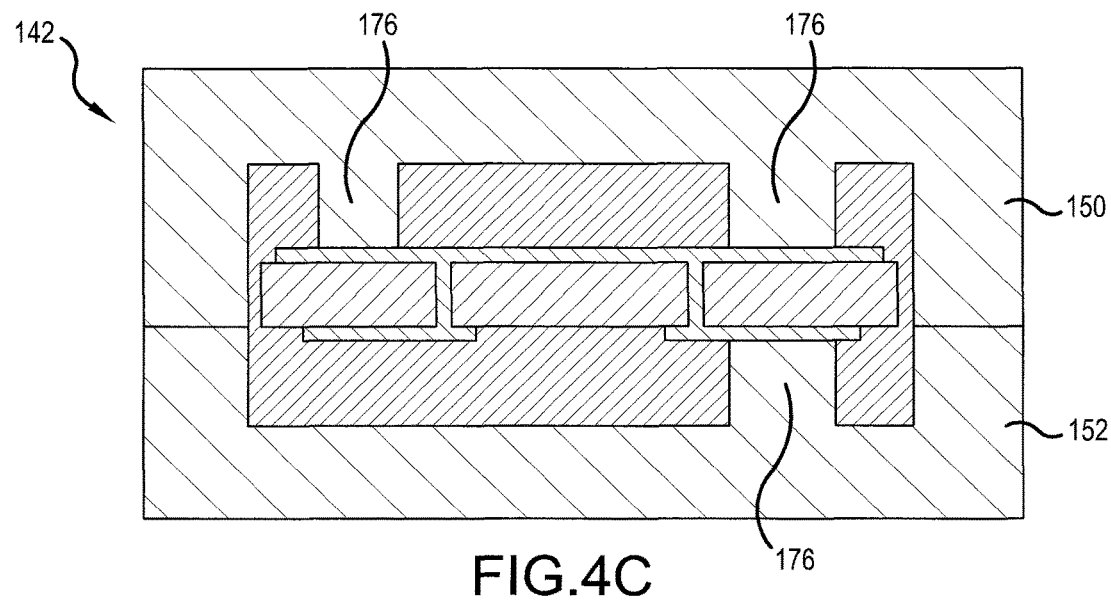

The resinous compound utilized to act as the electrically insulative cover 116 can then be injected into upper and lower cavities 172, 174 though the relevant injection channels 170, as illustrated in FIG. 4c.

Figure 4D:
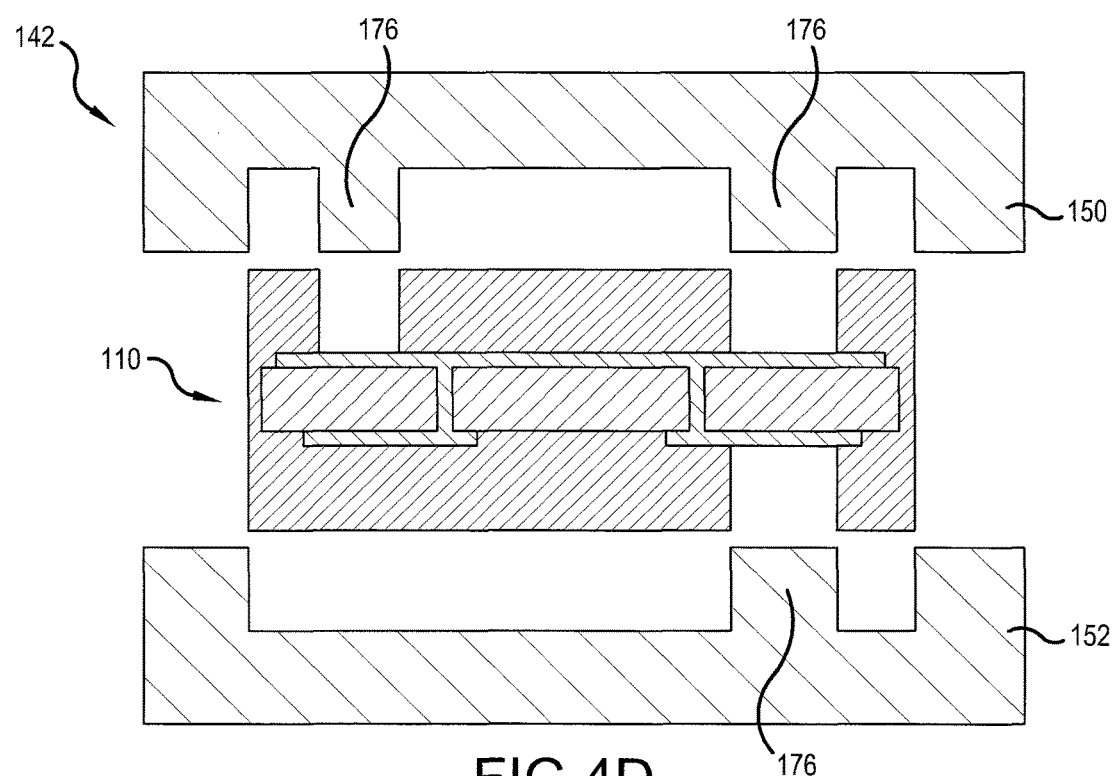

FIG. 4d then shows the actuation of the upper and lower injection mold elements 150, 152 away from the reel 134, leaving the new set resinous compound securely affixed to the printed circuit 112 as the electrically insulative cover layer 116.

Figure 4E:
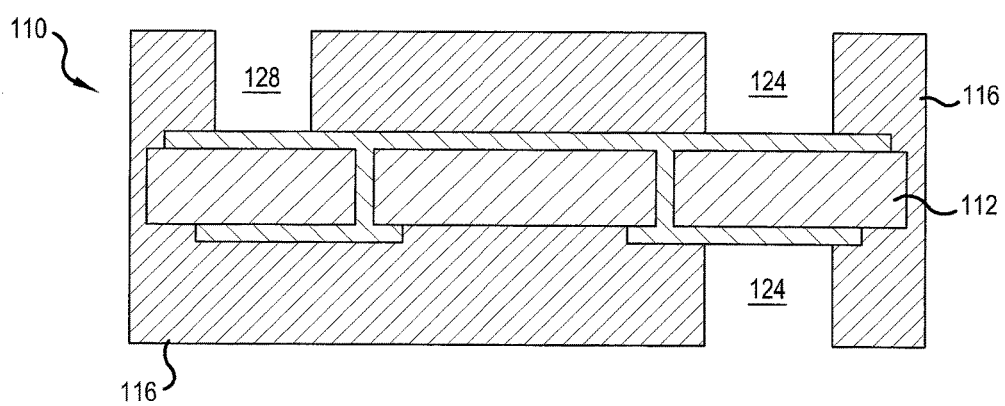

The reel 134 can then be linearly actuated, which is the direction out of the page in FIG. 4e, or alternatively substantially aligned, so as to be brought away from the injection molding tool 148. As such, the bio-sensor circuits 110 can be produced using a quasi-continuous batch process, with the reel being actuated into the injection molding tool 148, molding occurring for a number of printed circuits 112, and the reel then being spooled onwards.

As a result of the injection molding process, there will be a reel 134 including a number of bio-sensor circuits 110 printed thereon. These can then either be cut or punched out, and distributed individually, or the reel 134 itself could be distributed.

The result of this process are bio-sensor circuits 110 which have accurately positioned and dimensioned wells 128 which are therefore better suited for use with cyclic voltammetry measurements. Since a resinous compound is used, it fills the upper and lower cavities 172, 174 completely, molding to the internal shape of upper and lower injection mold elements 150, 152. As such, the wells 128 are formed to the external size of the cylindrical abutment elements 176.

It will be apparent from the above description and drawings that the electrically insulative cover layer could be applied to one side of the printed circuit, as illustrated in FIG. 1, or could be affixed to both sides of the printed circuit. Which of these will be chosen will likely depend on whether the circuit has been printed on both sides of the substrate or not.

Additionally, whilst the metering layer is described as being a separate element, it could just as easily be formed integrally with the electrically insulative coating layer during the injection molding process, thereby providing single use, fully-formed bio-sensor circuits for subsequent use.

The biochemical agent has here before been described as being associated with the or each electrically conductive contact sensor. This will typically be achieved by the deposition of the agent to the contact sensor subsequent to the injection molding process; however, it will be appreciated that the biochemical agent could be applied at any relevant stage of the formation of the bio-sensor circuit, provided that the risk of cross-contamination is reduced.

Whilst the reel-to-reel mechanism of the bio-sensor production method has been described as utilizing 35 mm reel and rollers having spigots to actuate and/or align the reel, it will be appreciated that any such suitable reel mechanism could be used to move the reel through the injection molding tool.

It is therefore possible to provide a bio-sensor circuit which is formed such that a protective layer of electrically insulative resin is applied to the underlying printed circuit, with one or more wells being simultaneously formed in the resin layer to allow access to one or more electrically conductive contact sensor of the bio-sensor circuit.

This can be primarily achieved by use of an injection molding process, wherein the resin is injected into an injection mold element, with abutment elements being provided which provide physical barriers to the resin, thereby forming the respective wells when set.

To best utilize such a process, it is therefore preferred to apply a plurality of printed circuits to a flexible reel which can be passed accurately through the injection molding tool thereby creating a quasi-continuous batch production scheme for the creation of bio-sensor circuits.

The words 'comprises/comprising' and the words 'having/including' when used herein with reference to the present invention are used to specify the presence of stated features, integers, steps or components, but do not preclude the presence or addition of one or more other features, integers, steps, components or groups thereof.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

The embodiments described above are provided by way of example only, and various other modifications will be apparent to persons skilled in the field without departing from the scope of the invention as defined herein.

For example, while the preferred thickness of the electrically insulative coating is at least 100 μm, due to current manufacturing techniques, it is possible to have a coating with a depth of between 50 and 300 μm.

Also, while the preferred printed circuit is flexible, it may be semi-flexible, rigid or comprise strips of rigid printed circuits.

The invention claimed is:

1. A bio-sensor circuit system for the production of bio-sensor circuits comprising:
    a bio-sensor production reel having an elongate substrate formed from a strip of electrically insulative material, the substrate including a plurality of index holes positioned symmetrically at or adjacent to both longitudinal sides of the substrate to enable actuation of the reel in a longitudinal direction, and a plurality of printed circuits printed in a parallel arrangement along the length of the substrate, the printed circuits each including at least one electrically conductive contact sensor;
    an injection molding tool having upper and lower injection mold elements being disposed above and below upper and lower surfaces of the reel, the upper and lower injection mold elements being capable of being actuated into engagement with the reel, thereby forming a cavity about each printed circuit between the upper and lower injection mold elements, the injection molding tool further including at least one abutment element capable of engaging with a portion of the surface of the reel inside the cavity when the upper and lower injection mold elements are actuated into engagement with the reel; and
    a sprocket feed roller capable of engagement with the index holes of the reel, wherein the roller is rotatable so as to effect actuation of the reel through the injection molding tool and to be spooled onwards and transferred in a reel-to-reel transferring.

2. A method of producing bio-sensor circuits using the bio-sensor circuit system of claim 1, comprising the steps of:
    a] actuating the reel using the sprocket feed roller so as to position at least one printed circuit between the upper and lower injection mold elements;
    b] actuating the upper and lower injection mold elements towards one another so as to form the cavity about each printed circuit, such that the said at least one abutment element contacts a relevant portion of a surface of the said at least one electrically conductive contact sensor;
    c] injecting a resinous substance into the cavity so as to cover an exposed area of a surface of the printed circuit;
    d] allowing the resinous substance to set and affix to the surface of the printed circuit; and
    e] separating the upper and lower injection mold elements leaving the set resinous substance as an electrically insulative coating on the surface of the printed circuit, a well being formed in the resinous substance at or adjacent the said at least one electrically conductive contact sensor as a result of the positioning of each abutment element, thereby forming the bio-sensor circuit;
    f] actuating the reel using the sprocket feed roller so as to position another at least one printed circuit between the upper and lower injection mold elements and enable the reel to be spooled onwards to achieve a repeatable reel-to-reel process.

3. The method of claim 2, further comprising step g], subsequent to step f], of separating the individually formed bio-sensor circuits from the reel following formation to form discrete bio-sensor circuits.

4. The method of claim 2, wherein in step d], the resinous substance set and affixed to the surface of the printed circuit has a depth between 50 and 300 μm to keep the reel to be woundable.

* * * * *